(12) United States Patent
Beasom

(10) Patent No.: US 6,614,088 B1
(45) Date of Patent: Sep. 2, 2003

(54) BREAKDOWN IMPROVEMENT METHOD AND STURCTURE FOR LATERAL DMOS DEVICE

(76) Inventor: James D. Beasom, 506 S. Wildwood La., Melbourne Village, FL (US) 32904

( * ) Notice: Subject to any disclaimer, the term of this patent is extended or adjusted under 35 U.S.C. 154(b) by 0 days.

(21) Appl. No.: 09/506,711

(22) Filed: Feb. 18, 2000

(51) Int. Cl.[7] ............................................... H01L 23/58
(52) U.S. Cl. ........................ 257/489; 257/488; 257/659
(58) Field of Search ................................. 257/659, 750, 257/758, 488, 489; 438/622, 652

(56) References Cited

U.S. PATENT DOCUMENTS

| | | | |
|---|---|---|---|
| 3,922,708 A | 11/1975 | Crowder et al. ............. | 257/537 |
| 4,782,460 A | * 11/1988 | Spencer ........................ | 706/39 |
| 4,823,173 A | 4/1989 | Beasom ........................ | 257/262 |
| 4,825,278 A | * 4/1989 | Hillenius et al. ............ | 257/630 |
| 4,926,243 A | 5/1990 | Nakagawa et al. .......... | 257/659 |
| 4,947,232 A | 8/1990 | Ashida et al. ............... | 257/336 |
| 5,040,045 A | * 8/1991 | McArthur et al. ........... | 257/341 |
| 5,043,781 A | 8/1991 | Nishiura et al. ............. | 257/296 |
| 5,264,719 A | 11/1993 | Beasom ........................ | 257/335 |
| 5,329,155 A | * 7/1994 | Lao et al. ..................... | 257/538 |
| 5,466,959 A | * 11/1995 | Goerlach et al. ............ | 257/361 |
| 5,466,963 A | 11/1995 | Beasom ........................ | 257/516 |
| 5,650,645 A | 7/1997 | Sone et al. ................... | 257/288 |
| 5,932,892 A | * 8/1999 | Hseuh et al. .................. | 257/59 |
| 6,110,804 A | * 8/2000 | Parthasarathy et al. ...... | 438/454 |

FOREIGN PATENT DOCUMENTS

EP     0-576-001 A1 * 12/1993    ........... H01L/29/06

OTHER PUBLICATIONS

International Search Report–PCT/US01/03701.

* cited by examiner

Primary Examiner—George C. Eckert, II

(57) ABSTRACT

In a lateral DMOS device 10 breakdown voltage is controlled by a voltage divider 50 coupled at opposite ends to the source 18 and drain 19. The divider node N1 between first and second resistive elements R1, R2 is connected to a second level conductive shield M2. ILD layer 34 isolates the shield M2 from first level conductive M1 contacts.

21 Claims, 3 Drawing Sheets

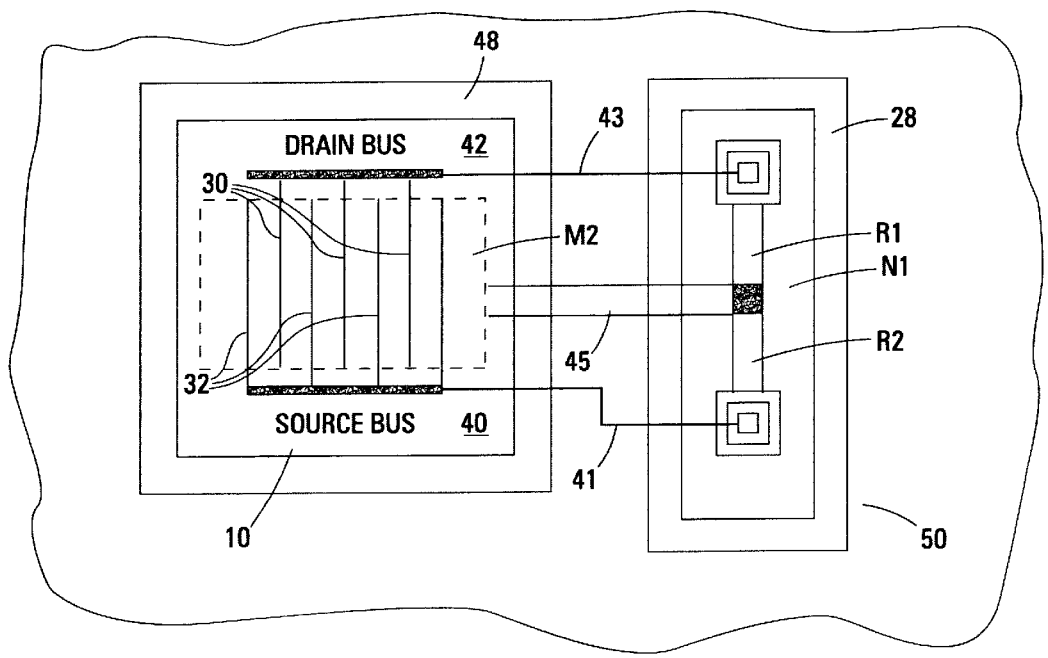
*Fig. 3*
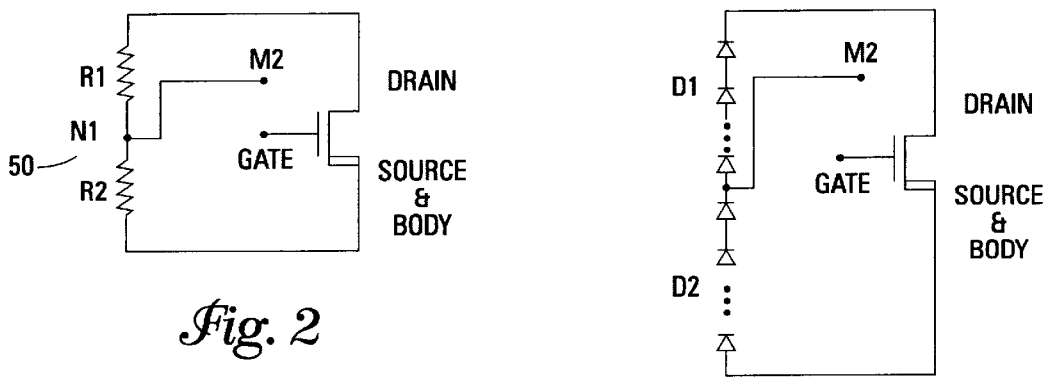
*Fig. 2*  *Fig. 4*

BREAKDOWN IMPROVEMENT METHOD AND STURCTURE FOR LATERAL DMOS DEVICE

BACKGROUND OF THE INVENTION

A known method for achieving optimized high breakdown voltages in MOS devices uses lateral drain extensions sometimes called lateral drift regions. Examples of such structures are shown and described in U. S. Pat. Nos. 4,823,173 and 5,264,719. These lateral drain extensions and drift regions may include single dopants of the same type as the source and drain or may include two types of dopants to establish a JFET (junction field effect transistor) drain extension.

Lateral DMOS devices, especially those with drain extensions, are often built with a second level conductor over the lateral extensions or over the entire device. See, for example, FIG. 1 where the second level of metal M2 extends over the entire device 10. The second level metal M2 performs two functions. It protects the device from diffusion of mobile impurities from the plastic package material and it protects the device from light which could cause photo-generated leakage current. Such lateral DMOS devices are often incorporated into multichip packages where one chip is a light-emitting diode and the second chip has a photo-diode coupled to one or more DMOS devices. This type of combination package is used to provide a relay that can be turned on and off without a mechanical switch. The M2 layer shields the operating DMOS devices from the light emitted by the LED.

However, I have found that while the M2 layer prevents impurities from entering the substrate, nevertheless, impurities from the plastic packaging material penetrate the M2 layer and can alter the breakdown characteristics of the underlying transistor. Charges accumulate in the M2 layer and the accumulated charges adversely affect the voltage at the surface of the transistor. These effects are most noticeable in regions such as region 4 where the first level metal terminates between two contacts that are maintained at high voltage differentials. For example, in a typical DMOS device, the source contact 32 and the drain contact 30 may be at a voltage differential of 100 or more volts. Any accumulated charge on the upper level metal M2 will affect the electric fields in the region 5 of the substrate that is between the terminations of the two contacts 32, 30.

In power DMOS devices it is desirable to have a high, or at least a constant, breakdown voltage. I have found that the breakdown voltage of the device is a maximum when the voltage of the M2 layer is at a value between the source voltage and the drain voltage. However, the breakdown voltage falls to a lower value when the voltage on M2 is either the source voltage or the drain voltage.

There are several ways of controlling the voltage on M2. It is possible to provide optimum bias on M2 without any direct electrical connection to it by allowing its voltage to be set by a capacitor divider action. In the capacitor divider configuration, the capacitors are formed by M2 and the source contact 32 and M2 and the drain contact 30. However, that method of biasing with a floating M1 by capacitor coupling is unreliable. During high temperature burn in when large drain-to-source bias voltages are applied, the breakdown voltage degrades. I believe this degradation is caused by charge migration of charges through the plastic package material and into the layer M2. I believe these charge the M2 to a voltage near the drain or source voltage.

Accordingly, there is a need for a more reliable and effective structure and method for improving breakdown voltage control and high voltage semiconductor devices.

SUMMARY

The problem is solved and the breakdown voltage is improved by forming a high value resistive voltage divider between the source and drain and by connecting the M2 layer to the divider node. Such a divider applies the desired voltage between source and drain voltages to M2. The divider drains off any charge that drifts to M2 through the package during operation. In other words, if the voltage across the source and drain differs by 100 volts, then the larger voltage divider is set to put the node between the resistive elements at 50 volts. Any charge that accumulates in M2 is drained off through the resistive voltage divider. The very low drainage currents have no adverse affect on the device.

The divider elements need not be linear so long as they create a suitable M2 voltage for any drain-to-source voltage. The divider should conduct low current at all drain voltages because its current adds to the off leakage of the MOS device to which it is connected. The two resistive elements can be identical to set the divider node at a voltage midway between the source and drain voltage. However, any resistive values that move the node from either the source or drain voltage improves performance.

The preferred embodiment of the invention is made in the same layer of polysilicon that is used for making the MOS gates. The polysilicon is suitably doped using one or more of the drain extension doping steps. This method allows resistors to be made simultaneously with existing process steps, thereby simplifying the method of manufacture. The only changes necessary in manufacture are a few extra masking changes to form the polysilicon resistors.

There are many other methods that could be used to make resistive elements and all such methods are deemed within the scope of the invention. For example, the resistors can be made from trench polysilicon resistors as taught in my U. S. Pat. No. 5,466,963, the entire disclosure of which is herein incorporated by reference. That patent discloses processes which employ trench isolation. The resistive divider could also be made from this series of reverse biased diodes that are formed in polysilicon. That technique exploits the leaky nature of such diodes to provide the required low current to M2. And still another embodiment of the invention a slightly conductive dielectric between M1 an M2 layers could be used as the divider since the slightly conductive dielectric would create resistors between the layers M1 and M2 with layer M2 connected to a first resistor in contact with the M1 source contact 32 and a second resistor in contact with the M1 drain contact 30.

This resistive divider biasing circuit can be applied to all MOS devices as well as to non-MOS devices which use lateral extensions to maximize their breakdown voltage. Such devices include high voltage diodes, bipolar transistors, SCRs and IGBTs.

DRAWINGS

FIG. 2 is a circuit schematic of the invention.

FIG. 3 is a top view of a device of FIG. 1 provided with the circuit of FIG. 2.

FIG. 4 is a circuit schematic of an alternate embodiment of the invention.

DETAILED DESCRIPTION

Figure 1:
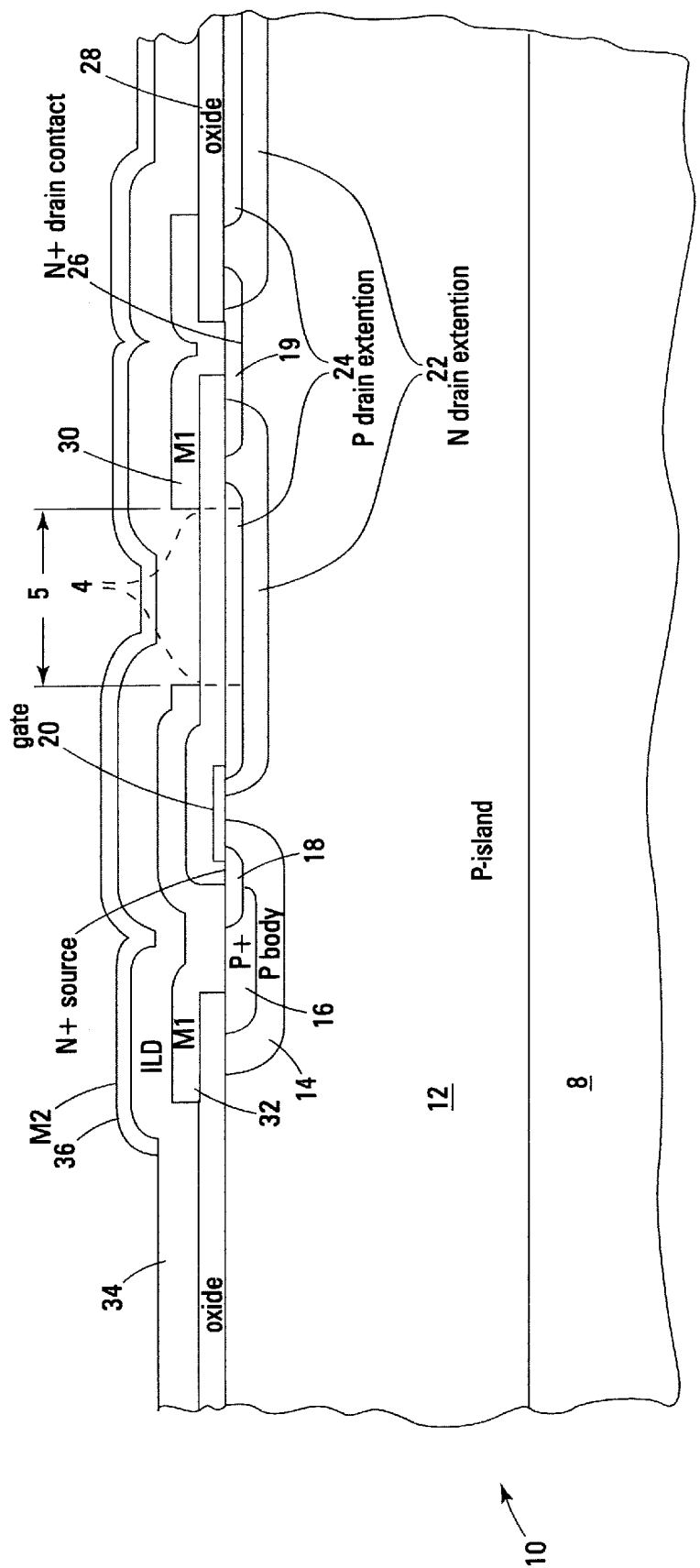
FIG. 1 is a cross-section of a lateral DMOS device.

Turning first to FIG. 1, there is shown a conventional lateral DMOS device 10 with a JFET drain extensions 22, 24. The device is formed in a substrate 8 that includes a P-type island 12. In the P-type island there is an N+source 18 and drain 19 on the surface of the substrate. A P+ body contact 16 is adjacent the source 18 and the source is entirely contained within the P body 14. A channel is formed by the P body between the N+ source 18 and the N+ drain 19. Over the channel there is a gate 20 typically of polysilicon. The gate is insulated from the surface of the substrate 8 by a gate oxide (not shown). Between the gate 20 and the drain contact 26 there is JFET drain extension that comprises the lightly doped P-type drain extension 24 that is enclosed in an N-type drain extension 22. The N-type drain extension 22 extends to and contacts the N+ drain contact 26. A first oxide layer 28 on the surface of the substrate has vias for receiving metal contacts 30, 32. These contacts are typically formed from a conductive material such as a metal layer M1 that is uniformly deposited over the oxide layer 28 and then patterned to form the contacts 30, 32 to the drain and source. The M1 layer contacts are covered by an ILD 34 (interlevel dielectric layer) which may be of deposited oxide or any other suitable insulating material. A second conductive material such as metal layer M2 is deposited on the ILD 34 and patterned to form the M2 shield 36 that covers the device above the drain extension. The region of potential breakdown for the device occurs between the opposing ends of the contacts 30, 32. At the surface of the substrate 8, the electric fields at the ends of the contacts 30, 32 tend to increase if there is no superior metal shielding. The upper layer M2 reduces those fields. Nevertheless, when M2 itself becomes charged, it can affect the voltage on the surface of the region 5 between the contacts 30 and 32. As the voltage on M2 shifts either towards the source or drain, the breakdown voltage is reduced from its optimum value. Accordingly, it is desirable to keep the breakdown voltage at its optimum value and this can be achieved by keeping M2 at a voltage between the source and drain.

FIG. 2 shows aschematic embodiment of the invention that achieves this result. A voltage divider consisting of resistors R1 and R2 is provided. The resistor R1 is in electrical contact with the drain and the resistor R2 is in electrical contact with the source and body. The two resistors are connected together and at their connection node N1, they are in turn connected to the second metal layer M2. R1 and R2 have the same approximate value. However, even resistors with very different values will provide some improvement when compared with devices without breakdown control dividers.

A preferred embodiment of the invention is shown in FIG. 3. There, the device 10 is shown in more detail. The source and drain regions are shown as a plurality of interdigitated regions. Each region is terminated at opposite ends in their respective drain lead 42 and source lead 40. The gate 20 is omitted but those skilled in the art understand that a conventional gate comprises a series of parallel stripes such as the stripe 20 shown in FIG. 1. One stripe is associated with each drain-to-source path such as that between source 18 and drain 19 in FIG. 1. The stripes are connected together outside the device. Crossunders are used to route the gate common line past either the drain or source fingers. The upper level metal layer M2 is shown as the larger, dashed rectangle. The device 10 is surrounded by an isolation trench 48 filled with an insulator, such as silicon dioxide.

Adjacent the device 10 is a resistor divider 50. The resistor divider 50 is a polysilicon resistor that includes a first resistive element R1 and a second resistive element R2. The two resistors are connected together at a node N1. The other end of R1 is connected to the drain bus 42 and the other end of R2 is connected to the source bus 40. Thus, the structure shown in FIG. 3 conforms to the schematic shown in FIG. 2. The metal connector 45 connects the node N1 to the metal layer M2. The resistor divider 50 is isolated from the device by field oxide, not shown and deposited oxide layer 28.

Figure 5:
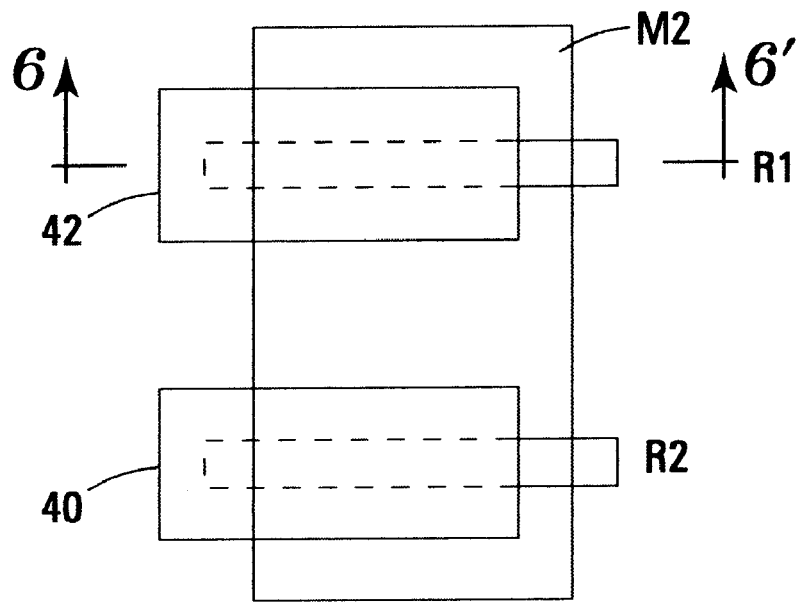
FIGS. 5 and 6 show the resistive elements beneath the source and drain buses.
Figure 6:
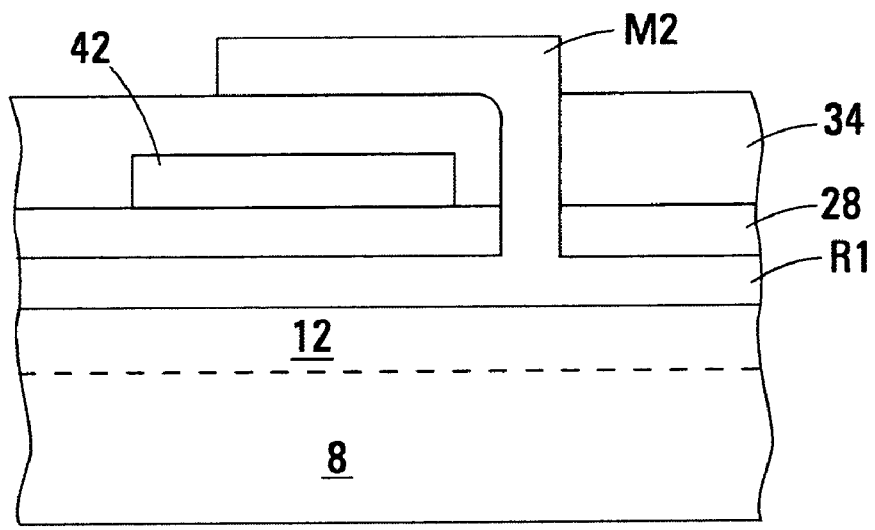

The resistors R1 and R2 can be formed at or about the same time that the gate 20 is formed. Both the gate and the resistors R1 and R2 are made of polysilicon that is deposited either on a field oxide (not shown) on the surface of the substrate. The resistors R1 and R2 are masked while the gate 20 is rendered conductive. The resistors R1 and R2 are doped to a highly resistive value by exposure during doping of either the N or the-type drain extension 22, 24. The doping in the P and the N-type drain extensions are about three orders of magnitude less than the doping of the gate and the source and drain regions. In other words, they are more than 1,000 times less conductive than the source or drain or gate. While the FIG. 3 shows the resistors R1 and R2 as elongated rectangles in shape, those skilled in the art will appreciate that they may be fabricated in any particular shape, including a serpentine configuration, in order to achieve the desired resistance. The resistors can be formed under the drain and source busses. That layout allows them to be made without increasing the size of the circuit. Only the ends that contact the M2 need extend out beyond the busses. Over 80% of the resistors are under the busses. See FIGS. 5 and 6.

In operation, when a voltage differential appears across the source and drain, that same voltage differential appears across the divider 50 comprising resistors R1 and R2. If R1 and R2 are approximately the same value, then the same voltage will be dropped across each resistor. As a result, the voltage at node N1 and shield M2 will be approximately half the voltage between the source and drain. Likewise, if any charge accumulates upon M2, that charge will be dissipated through the resistors R1 and R2.

In addition to the resistor structure shown in FIG. 3, those skilled in the art will appreciate that resistors may be formed in trenches such as shown and described in my U. S. Pat. No. 5,466,963, the entire disclosure of which is herein incorporated by reference. Another embodiment of the invention is shown in FIG. 4. There, a first set of diodes D1 is connected to a second set of diodes D2. The diodes D1 and D2 are sets of one or more diodes formed in a layer of polysilicon. A layer of polysilicon is deposited on a same substrate 8 as the device 10 but adjacent thereto in a manner similar to the resistor divider 50 shown in FIG. 3. In other words, the resistors R1 and R2 are replaced by sets of diodes D1, D2. The diodes are reverse biased and thus present high impedance when there is a voltage across the source and drain. However, it is well-known that polysilicon diodes are leaky. As such, any charge that accumulates on the layer M2 will leak through the diodes to the source or drain.

In still another embodiment of the invention, it is possible to modify the ILD layer 34 of the LDMOS 10 in order to create a resistor divider. In this case, the ILD layer 34 is rendered at least slightly conductive in the regions above the contacts 32 and 30. By making the ILD 34 slightly resistive and conductive in those regions, resistors are created between source metal contact 32 and metal layer M2 and between metal layer M2 and drain contact 30. Layer M2 becomes the node N1 of the divider.

Having thus described several embodiments of the invention, those skilled in the art will appreciate the further modifications, changes, omissions and additions to the disclosed embodiments may be made without departing from the spirit and scope of the invention as set forth in the attached claims. Moreover, those skilled in the art will appreciate that the resistors R1 and R2 may be formed in one or more polysilicon layers or other layers that are over the substrate 8 or even within the substrate 8. However, forming such resistors in that environment may require further steps in the process for fabricating the overall device.

What is claimed is:

1. An integrated circuit including one or more high voltage devices, each high voltage device subject to a relatively high voltage differential between two terminals of the device, with an improved voltage breakdown structure comprising in combination:

a substrate of semiconductor material;

a first and second highly doped device terminal regions in the substrate;

a first insulating layer on the substrate comprising vias to the terminal regions;

a first conductive layer over the insulating layer and comprising first and second conductive contacts, said first and second conductive contacts spaced laterally apart from each other and extending through the vias in the first insulating layer to contact the respective terminal regions;

a second insulating layer over the conductive contacts;

a second conductive layer on the second insulating layer, and extending over and between the conductive contacts;

means for dividing a voltage between the conductive contacts to a lower voltage and for coupling the lower voltage to the second conductive layer;

two sets of interdigitated source and drain regions, each set terminating at a respective source and drain bus with the means for dividing voltage connected at one end to the source bus and at its other end to the drain bus; and wherein said voltage dividing means has at least a portion there of positioned under said buses.

2. The integrated circuit of claim 1 where in the means for dividing the voltage includes means for conducting charge from the second conductive layer.

3. The integrated circuit of claim 1 wherein the means for dividing the voltage comprises first and second resistive elements connected in series with each other, the first resistive element connected at one end to one conductive contact, the second resistive element connected at one end to the other conductive contact, the other ends of the resistive elements connected together and to the second conductive layer.

4. The integrated circuit of claim 3 further comprising a layer of polysilicon disposed over the substrate and comprising the first and second resistive elements.

5. The integrated circuit of claim 4 wherein the polysilicon layer comprises first and second polysilicon resistors.

6. The integrated circuit claim 4 wherein the layer of polysilicon disposed over the substrate comprises a plurality of reversed biased diodes formed in the polysilicon for providing the first and second resistive elements.

7. The integrated circuit of claim 1 wherein portions of one of the insulating layers are slightly doped to provide the resistive elements.

8. The integrated circuit of claim 1 wherein the high voltage devices are selected from the group consisting of diodes, silicon controlled rectifiers, field effect transistors, bipolar transistors, and insulated gate bipolar transistors.

9. The integrated circuit of claim 1 wherein one of the high voltage devices is a lateral DMOS device and further comprises:

a body region and a body contact region of a first conductivity in the surface of the substrate;

a source region of a second, opposite conductivity, at the surface of the substrate and extending into the body region, said body region adjacent said source region and forming a channel region;

an insulated gate covering the channel region;

a drain region of the second conductivity in the surface of the substrate and extending into the substrate; and a drain extension disposed between the source and the drain.

10. An integrated circuit including one or more lateral DMOS devices with improved voltage breakdown, said improved lateral DMOS devices comprising:

a substrate of semiconductor material;

a body region and a body contact region of a first conductivity in the surface of the substrate;

a source region of a second, opposite conductivity, at the surface of the substrate and extending into the body region, a portion of said body region forming a channel region;

an insulated gate covering the channel region;

a drain region of the second conductivity in the surface of the substrate and extending into the substrate;

a jfet drain extension disposed between the source and drain regions;

a first insulating layer on the substrate for insulating the first layer conductive contacts from the other regions on the surface of the substrate and comprising vias above the source and drain regions;

a first layer of conductive material over the substrate comprising the source and drain contacts for contacting the source and drain regions in the substrate through said vias;

a second insulating layer on the first conductive layer;

a second conductive layer on the second insulating layer, and overlapping the first layer of conductive material, the source and drain contacts and covering the jfet drain extension between them; and a voltage divider comprising first and second resistive elements connected in series with each other, the first resistive element connected at one end to the source, the second resistive element connected at one end to the drain, the other ends of the resistive elements connected together and to the second conductive layer;

two sets of interdigitated source and drain regions, source and drain buses respectively coupled to the corresponding set of interdigitated source and drain regions; and wherein at least a portion of one resistive element is positioned under either said drain bus or said source bus, and at least a portion of the other resistive element is positioned under the other said drain bus or said source bus.

11. The integrated circuit with improved lateral DMOS devices of claim 10 further comprising a layer of polysilicon disposed over the substrate and comprising the first and second resistive elements.

12. The integrated circuit with improved lateral DMOS devices of claim 11 wherein the polysilicon layer comprises first and second polysilicon resistors.

13. The integrated circuit with improved lateral DMOS devices of claim 11 wherein the layer of polysilicon disposed over the substrate comprises a plurality of reversed biased diodes formed in the polysilicon for providing the first and second resistive elements.

14. The integrated circuit with improved lateral DMOS devices of claim 10 wherein portions of one of the insulating layers are slightly doped to provide the resistive elements.

15. The integrated circuit with improved lateral DMOS device of claim 10 wherein the drain extensions comprise a jfet extension with an outer region of a second conductivity and an inner region of the first conductivity.

16. In a lateral DMOS device with a source, a gate, drain, a drain extension and a conductive layer over the drain extension and isolated from the device by an insulating layer, the improvement comprising;
    a voltage divider having first and second resistive elements connected in series with each other, one end of said voltage divider connected to the source and the other end of said voltage divider connected to the drain, and said voltage divider connected to the conductive layer at the series connection of the resistive elements;
    two sets of interdigitated source and drain regions, and a source and a drain bus respectively coupled to the corresponding set of interdigitated source and drain regions; and
    wherein at least a portion of one resistive element is positioned under either said drain bus or said source bus, and at least a portion of the other resistive element is positioned under the other said drain bus or said source bus.

17. The lateral DMOS device of claim 16 further comprising a layer of polysilicon disposed over the substrate and comprising the first and second resistive elements.

18. The lateral DMOS device of claim 17 wherein the first and second resistive elements comprise first and second polysilicon resistors.

19. The lateral DMOS device of claim 16 further comprising a layer of polysilicon disposed over the substrate with a plurality of reversed biased diodes formed in the polysilicon layer for providing the first and second resistive elements.

20. The lateral DMOS device of claim 16 wherein portions of the insulating layer is slightly doped to provide the resistive elements.

21. An integrated circuit including one or more high voltage devices, each high voltage device subject to a relatively high voltage differential between two terminals of the device, with an improved voltage breakdown structure comprising in combination:
    a substrate of semiconductor material;
    first and second highly doped device terminal regions in the substrate;
    a source region and a drain region, said drain region having a drain extension;
    a first insulating layer on the substrate comprising vias to the terminal regions;
    a first conductive layer over the insulating layer and comprising first and second conductive contacts, said first and second conductive contacts spaced laterally apart from each other and extending through the vias in the first insulating layer to contact the respective terminal regions;
    a second insulating layer over the conductive contacts;
    a second conductive layer on the second insulating layer, extending over and between the conductive contacts;
    means for dividing a voltage between the conductive contacts to a lower voltage and for connecting the lower voltage to the second conductive layer; and
    wherein said means for dividing the voltage is positioned laterally away from said source and drain regions, said drain extension, and a channel formed between said source and drain regions.

* * * * *